(12) United States Patent
Zhu

(10) Patent No.: US 11,647,613 B2
(45) Date of Patent: May 9, 2023

(54) INFRARED SAUNA ROOM WITH LOW ELECTRIC FIELD AND ELECTROMAGNETIC WAVE RADIATION

(71) Applicant: WUXI SAUNAPRO TECHNOLOGY CO., LTD, Jiangsu (CN)

(72) Inventor: Xuanzhi Zhu, Jiangsu (CN)

(73) Assignee: WUXI SAUNAPRO TECHNOLOGY CO., LTD, Wuxi (CN)

( * ) Notice: Subject to any disclaimer, the term of this patent is extended or adjusted under 35 U.S.C. 154(b) by 0 days.

(21) Appl. No.: 17/507,787

(22) Filed: Oct. 21, 2021

(65) Prior Publication Data
US 2022/0046834 A1   Feb. 10, 2022

Related U.S. Application Data

(63) Continuation of application No. PCT/CN2019/114193, filed on Oct. 30, 2019.

(30) Foreign Application Priority Data

Apr. 30, 2019   (CN) .......................... 201910360285.2

(51) Int. Cl.
  *H05K 9/00*    (2006.01)
  *H05B 3/18*    (2006.01)

(52) U.S. Cl.
  CPC ............ *H05K 9/0003* (2013.01); *H05B 3/18* (2013.01); *H05K 9/0088* (2013.01); *H05B 2203/032* (2013.01)

(58) Field of Classification Search
  CPC ........................... H05K 9/0088; H05K 9/0003
  See application file for complete search history.

(56) References Cited

U.S. PATENT DOCUMENTS

| | | | | |
|---|---|---|---|---|
| 2012/0241440 | A1* | 9/2012 | Duncan | H05B 6/44 219/600 |
| 2017/0370026 | A1* | 12/2017 | Perera | H05K 9/0088 |
| 2020/0015323 | A1* | 1/2020 | Chen | F24D 13/02 |
| 2020/0398078 | A1* | 12/2020 | Jensen | A61H 33/06 |
| 2021/0378062 | A1* | 12/2021 | Shin | H05K 9/0098 |

FOREIGN PATENT DOCUMENTS

| | | |
|---|---|---|
| CN | 204190959 U | 3/2015 |
| CN | 105072716 A | 11/2015 |

OTHER PUBLICATIONS

International Search Report of PCT Patent Application No. PCT/CN2019/114193 dated Feb. 6, 2020.

* cited by examiner

*Primary Examiner* — Hung V Ngo

(57) ABSTRACT

The present invention provides an infrared sauna room with a low electric field and low electromagnetic wave radiation comprising a room body, heating plates with a low electric field and low electromagnetic wave radiation and shielding lines, wherein a plurality of heating plates with a low electric field and low electromagnetic wave radiation are distributed in the room body; the first insulating layer has concave points or/and convex points; and the shielding line comprises a stranded power wire, an electric field absorbing shielding layer and a wire insulating layer. Through the above-mentioned manner, the infrared sauna room with a low electric field and low electromagnetic wave radiation can significantly reduce electromagnetic wave radiation and electric field radiation for sauna rooms.

10 Claims, 2 Drawing Sheets

INFRARED SAUNA ROOM WITH LOW ELECTRIC FIELD AND ELECTROMAGNETIC WAVE RADIATION

CROSS REFERENCE TO RELATED APPLICATIONS

The present application is a Continuation Application of PCT Application No. PCT/CN2019/114193 filed on Oct. 30, 2019, which claims the benefit of Chinese Patent Application No. 201910360285.2 filed on Apr. 30, 2019. All the above are hereby incorporated by reference in their entirety.

TECHNICAL FIELD

The present invention relates to the technical field of radiation shielding, particularly to an infrared sauna room with a low electric field and low electromagnetic wave radiation.

BACKGROUND ART

A sauna room is intended to provide a treating and skin cleaning effect through heating space. The heat enables a human body to sweat and alleviates pain of muscles and joints, thus achieving the treating effect. In traditional sauna rooms, an open fire and a closed stove are used to produce steam for generating heat. But heat radiation by the open fire can lead to a sauna room full of smoke. Heat generated by the open fire does not last a long period, so endless consumption of inflammable materials is needed. Even though a firewood stove can maintain temperature for a long period, the stove itself shields part of the heat.

In order to overcome above-mentioned defects, electric heaters are developed for using in a sauna room, which is widely popular. These electric heaters include resistance heaters, heat radiation heaters and so on. For example, an infrared heating plate generates infrared radiation in an infrared spectrum, and the infrared radiation activates molecules in a human body in a sauna room for thermogenesis. Such a sauna room can warm the human body in a more effective and comfortable way to reach the temperature for sweating than traditional sauna rooms.

In some cases, it is easy for current infrared sauna rooms to generate electric field radiation and electromagnetic wave radiation, which are usually harmful to the human body. Therefore, an infrared sauna room shielding radiation is needed.

SUMMARY OF THE INVENTION

The technical problem to be solved by the present invention is to provide an infrared sauna room with a low electric field and low electromagnetic wave radiation, in order to significantly reduce electromagnetic wave radiation and electric field radiation by the sauna room.

In order to solve the above-mentioned technical problem, the present invention adopts the following technical solution. An infrared sauna room with a low electric field and low electromagnetic wave radiation is provided, comprising a room body, heating plates with a low electric field and low electromagnetic wave radiation and shielding lines, wherein a plurality of heating plates with a low electric field and low electromagnetic wave radiation are distributed in the room body and are connected to corresponding shielding lines; the heating plate with a low electric field and low electromagnetic wave radiation comprises a first insulating layer, a second insulating layer, a third insulating layer, a fourth insulating layer, a fifth insulating layer, a first electric field shielding layer, a second electric field shielding layer, a first heating body and a second heating body; the second insulating layer and the third insulating layer are arranged on an upper surface and a lower surface of the first heating body, respectively; the first electric field shielding layer is arranged between the second insulating layer and the first insulating layer; the second heating body is arranged on a lower surface of the third insulating layer; the fourth insulating layer is arranged on a lower surface of the second heating body; the second electric field shielding layer is arranged between the fourth insulating layer and the fifth insulating layer; the first insulating layer has concave points or/and convex points; the shielding line comprises a stranded power wire, an electric field absorbing shielding layer and a wire insulating layer; the electric field absorbing shielding layer is wrapped outside the stranded power wire; and the wire insulating layer is wrapped outside the electric field absorbing shielding layer.

In a preferable embodiment of the present invention, materials for the first electric field shielding layer and the second electric field shielding layer are aluminum foil, copper foil, silver paste, conductive carbon black, conductive nickel black or graphene.

In a preferable embodiment of the present invention, the first heating body and the second heating body are respectively conductive heating graphene or conductive heating carbon black.

In a preferable embodiment of the present invention, the first insulating layer, the second insulating layer, the third insulating layer, the fourth insulating layer and the fifth insulating layer are epoxy resin boards or PET.

In a preferable embodiment of the present invention, the electric field absorbing shielding layer is aluminum foil or a metal net.

In a preferable embodiment of the present invention, the wire insulating layer is sleeved with a metal pipe, a metal corrugated pipe, aluminum foil or copper foil.

In a preferable embodiment of the present invention, an outer surface of the wire insulating layer is coated with conductive carbon black, conductive nickel black or graphene.

In a preferable embodiment of the present invention, the concave points or convex points are in a hemispherical, cylindrical, conical or irregular shape.

In a preferable embodiment of the present invention, the concave points or convex points are evenly distributed on a surface of the first insulating layer.

In a preferable embodiment of the present invention, the concave points or convex points are randomly distributed on a surface of the first insulating layer.

The beneficial effects of the present invention are as follows. The infrared sauna room with a low electric field and low electromagnetic wave radiation provided by the present invention has the following advantages:

1. through the arrangement of the first electric field shielding layer and the second electric field shielding layer, radiation generated by electric fields of the heating plates is absorbed, and then guided into the ground through a ground wire;

2. since the sinusoidal alternating currents of the two heating bodies have phases opposite to each other, electromagnetic waves generated by the two heating bodies have phases opposite to each other; and when the two waves are overlapped, electromagnetic wave radiation is effectively removed via offset; and 3. electric field radiation generated by wires is absorbed by a shielding material, and then guided into the ground through the ground wire; and the effect of electromagnetic wave radiation shielding is achieved when the wire and stranded wire are twisted.

BRIEF DESCRIPTION OF THE DRAWINGS

In order to more clearly describe the technical solution in embodiments of the present invention, drawings needed to describe embodiments will be described briefly below. Obviously, drawings described below are only some embodiments of the present invention. According to these drawings, those skilled in the art can obtain other drawings without creative work, in which.

DETAILED DESCRIPTION OF THE INVENTION

The technical solution of an embodiment of the present invention will be clearly and completely described below. Obviously, not all but only some embodiments of the present invention are described here. On the basis of the embodiments of the present invention, all other embodiments obtained by those skilled in the art without creative work are within the scope protected by the present invention.

Figure 1:
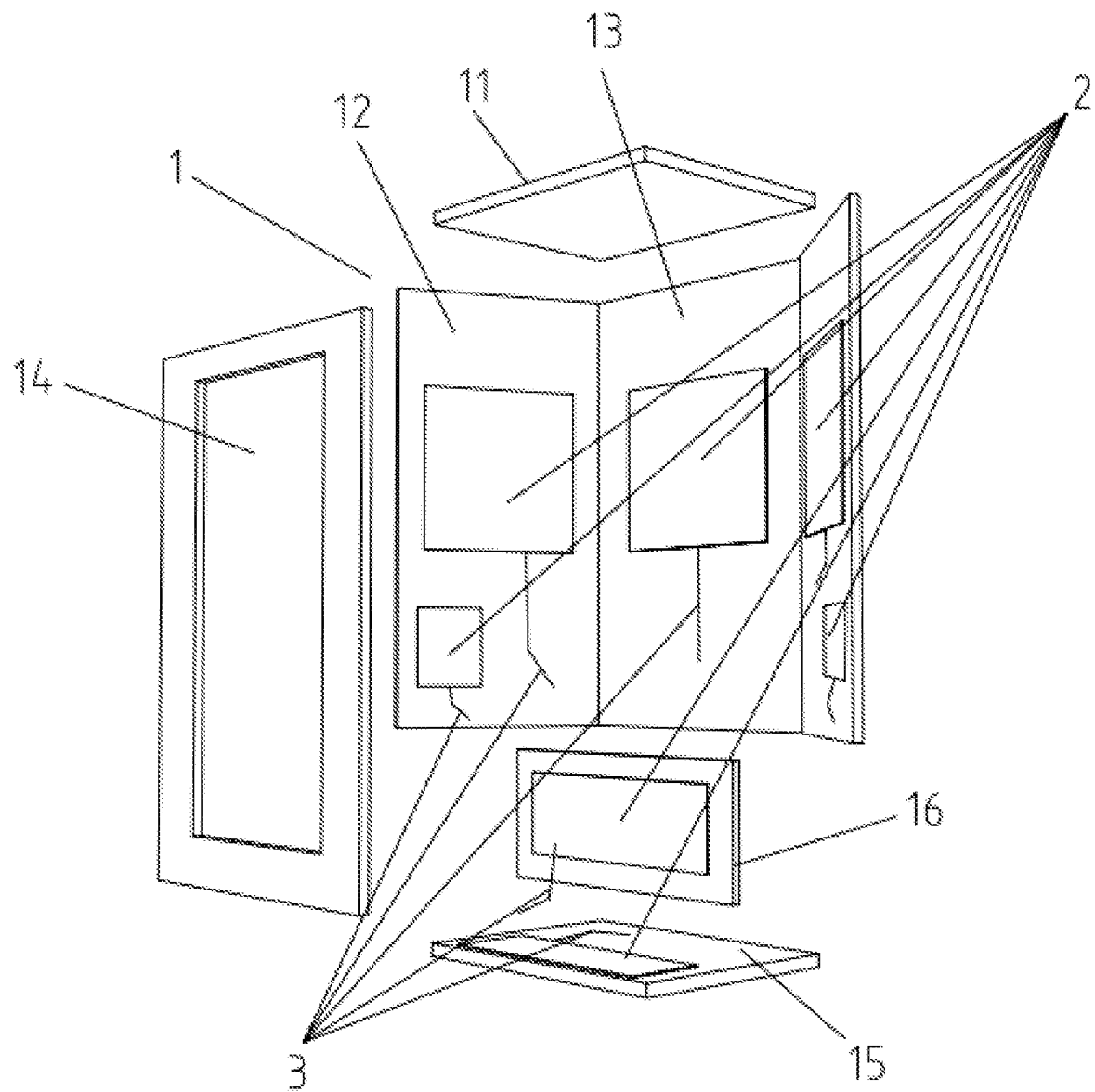
FIG. 1 is an exploded view of an infrared sauna room with a low electric field and low electromagnetic wave radiation.
Figure 2:
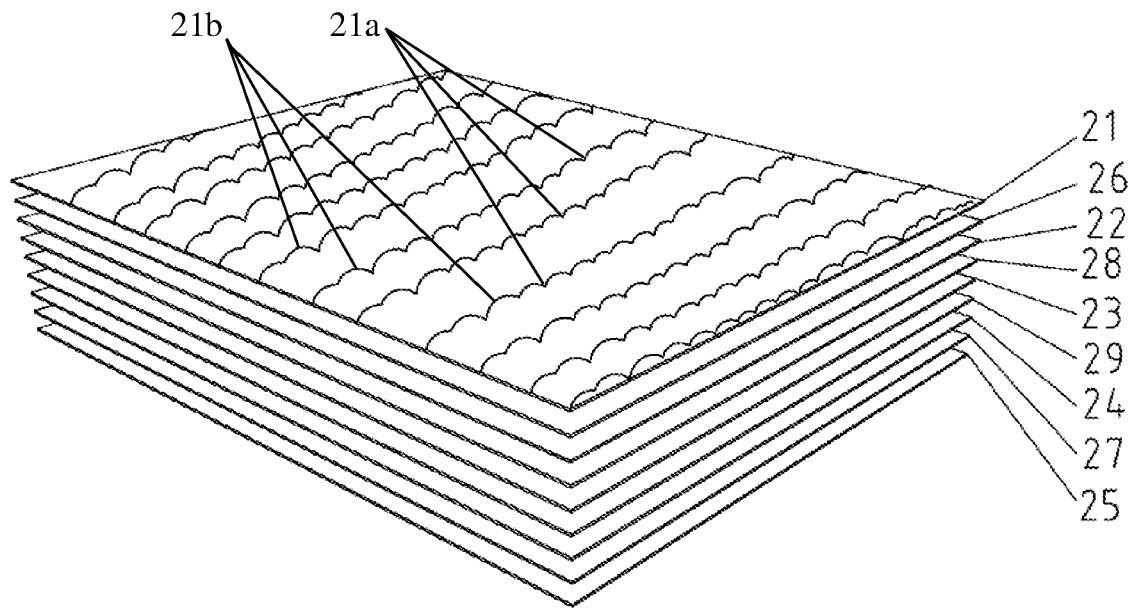
FIG. 2 is a structural schematic view of a heating plate with a low electric field and low electromagnetic wave radiation.
Figure 3:
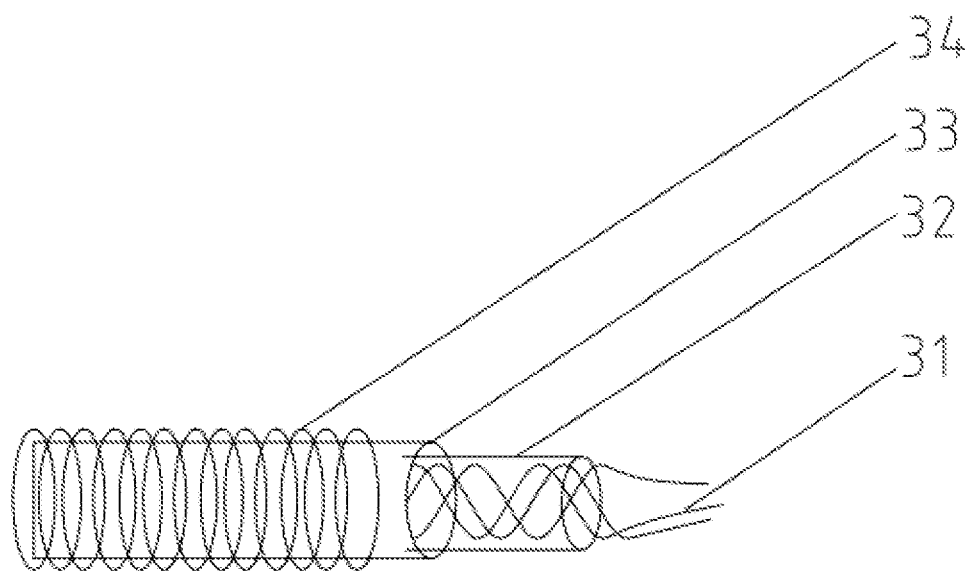
FIG. 3 is a structural schematic view of a shielding line.

With reference to FIGS. 1 to 3, an embodiment of the present invention includes: an infrared sauna room with a low electric field and low electromagnetic wave radiation comprising a room body 1, heating plates 2 with a low electric field and low electromagnetic wave radiation and shielding lines 3, wherein the room body 1 comprises a top cover 11, a side sheet 12, a rear sheet 13, a front sheet 14, a base 15 and a baffle plate 16, the side sheet 12, the rear sheet 13, the base 15 and the baffle plate 16 are provided with the heating plates 2 with a low electric field and low electromagnetic wave radiation which are connected to corresponding shielding lines 3.

The heating plate 2 with a low electric field and low electromagnetic wave radiation comprises a first insulating layer 21, a second insulating layer 22, a third insulating layer 23, a fourth insulating layer 24, a fifth insulating layer 25, a first electric field shielding layer 26, a second electric field shielding layer 27, a first heating body 28 and a second heating body 29. The first heating body 28 and the second heating body 29 are respectively conductive heating graphene or conductive heating carbon black. Since sinusoidal alternating currents of the two heating bodies have phases opposition to each other, electromagnetic waves generated by the two heating bodies have phases opposition to each other; and when the two waves are overlapped, electromagnetic wave radiation is effectively removed via offset.

An upper surface and a lower surface of the first heating body 28 are provided with the second insulating layer 22 and the third insulating layer 23, respectively. Between the second insulating layer 22 and the first insulating layer 21 is provided with the first electric field shielding layer 26. The first electric field shielding layer 26 is printed on an upper surface of the second insulating layer 22 or a lower surface of the first insulating layer 21, and then the second insulating layer 22 and the first insulating layer 21 are pressed together.

A lower surface of the third insulating layer 23 is provided with the second heating body 29. A lower surface of the second heating body 29 is provided with the fourth insulating layer 24. Between the fourth insulating layer 24 and the fifth insulating layer 25 is provided with the second electric field shielding layer 27. The second electric field shielding layer 27 is printed on a lower surface of the fourth insulating layer 24 or an upper surface of the fifth insulating layer 25, and then the fourth insulating layer 24 and the fifth insulating layer 25 are pressed together.

Materials for the first electric field shielding layer 26 and the second electric field shielding layer 27 are aluminum foil, copper foil, silver paste, conductive carbon black, conductive nickel black or graphene. The material for the first electric field shielding layer 26 and the second electric field shielding layer 27 is preferably copper foil. Through the arrangement of the first electric field shielding layer 26 and the second electric field shielding layer 27, electric field radiation generated by the heating plates is absorbed, and then guided into the ground through a ground wire.

The first insulating layer 21, the second insulating layer 22, the third insulating layer 23, the fourth insulating layer 24 and the fifth insulating layer 25 are epoxy resin boards or PET (polyethylene terephthalate). A material of the first insulating layer 21, the second insulating layer 22, the third insulating layer 23, the fourth insulating layer 24 and the fifth insulating layer 25 is preferably the epoxy resin board with a remarkable insulating effect.

The first insulating layer 21 has concave points 21a or/and convex points 21b. The concave points 21a or convex points 21b are hemispherical and are evenly distributed on a surface of the first insulating layer 21. Through the arrangement of the concave points 21a or/and convex points 21b on the first insulating layer 21 (a working face) of the heating plate, a heating area of the heating plate is effectively increased, and the concave points 21a and convex points 21b can achieve the effect of health care and massage.

The shielding line 3 comprises a stranded power wire 31, an electric field absorbing shielding layer 32 and a wire insulating layer 33. The stranded power wire 31 is wrapped by the electric field absorbing shielding layer 32; and the electric field absorbing shielding layer 32 is wrapped by the wire insulating layer 33. The electric field absorbing shielding layer 32 is aluminum foil or a metal net, thus effectively shielding electric field radiation generated by wires. The stranded power wire 31 is formed with stranded wires, so as to shield electromagnetic wave radiation generated by wires.

The wire insulating layer 33 is sleeved with a shielding pipe sleeve 34 which is a metal pipe, a metal corrugated pipe, aluminum foil or copper foil and is used for shielding electric field radiation. Or, an outer surface of the wire insulating layer 33 is coated with conductive carbon black, conductive nickel black or graphene so as to also shield electric field radiation.

To sum up, the infrared sauna room with a low electric field and low electromagnetic wave radiation provided by the present invention has the following advantages:

1. through the arrangement of the first electric field shielding layer and the second electric field shielding layer, radiation generated by electric fields of the heating plates is absorbed, and then guided into the ground through a ground wire;

2. since the sinusoidal alternating currents of the two heating bodies have phases opposite to each other, electromagnetic waves generated by the two heating bodies have phases opposite to each other; and when the two waves are overlapped, electromagnetic wave radiation is effectively removed via offset; and 3. electric field radiation generated by wires is absorbed by a shielding material, and then guided into the ground through the ground wire; and the effect of electromagnetic wave radiation shielding is achieved when the wire and stranded wire are twisted.

The embodiments of the present invention are only described above, and is not intended to limit patent scope of the invention. All equivalent structures or equivalent control flow variations made by using the description of the present invention, or direct or indirect adoption of the present invention in other relevant technical fields are thereby within the protection scope for the present invention.

What is claimed is:

1. An infrared sauna room with a low electric field and low electromagnetic wave radiation, comprising a room body, heating plates with a low electric field and low electromagnetic wave radiation and shielding lines, wherein a plurality of heating plates with a low electric field and low electromagnetic wave radiation are distributed in the room body; the plurality of heating plates with a low electric field and low electromagnetic wave radiation are connected to corresponding shielding lines; the heating plate with a low electric field and low electromagnetic wave radiation comprises a first insulating layer, a second insulating layer, a third insulating layer, a fourth insulating layer, a fifth insulating layer, a first electric field shielding layer, a second electric field shielding layer, a first heating body and a second heating body; the second insulating layer and the third insulating layer are arranged on an upper surface and a lower surface of the first heating body, respectively; the first electric field shielding layer is arranged between the second insulating layer and the first insulating layer; the second heating body is arranged on a lower surface of the third insulating layer; the fourth insulating layer is arranged on a lower surface of the second heating body; the second electric field shielding layer is arranged between the fourth insulating layer and the fifth insulating layer; the first insulating layer has concave points or/and convex points; each shielding line comprises a stranded power wire, an electric field absorbing shielding layer and a wire insulating layer; the electric field absorbing shielding layer is wrapped outside the stranded power wire; and the wire insulating layer is wrapped outside the electric field absorbing shielding layer.

2. The infrared sauna room with a low electric field and low electromagnetic wave radiation as claimed in claim 1, characterized in that materials for the first electric field shielding layer and the second electric field shielding layer are aluminum foil, copper foil, silver paste, conductive carbon black, conductive nickel black or graphene.

3. The infrared sauna room with a low electric field and low electromagnetic wave radiation as claimed in claim 1, characterized in that the first heating body and the second heating body are respectively conductive heating graphene or conductive heating carbon black.

4. The infrared sauna room with a low electric field and low electromagnetic wave radiation as claimed in claim 1, characterized in that the first insulating layer, the second insulating layer, the third insulating layer, the fourth insulating layer and the fifth insulating layer are epoxy resin boards or PET (polyethylene terephthalate).

5. The infrared sauna room with a low electric field and low electromagnetic wave radiation as claimed in claim 1, characterized in that the electric field absorbing shielding layer is aluminum foil or a metal net.

6. The infrared sauna room with a low electric field and low electromagnetic wave radiation as claimed in claim 1, characterized in that the wire insulating layer is sleeved with a metal pipe, a metal corrugated pipe, aluminum foil or copper foil.

7. The infrared sauna room with a low electric field and low electromagnetic wave radiation as claimed in claim 1, characterized in that an outer surface of the wire insulating layer is coated with conductive carbon black, conductive nickel black or graphene.

8. The infrared sauna room with a low electric field and low electromagnetic wave radiation as claimed in claim 1, characterized in that the concave points or convex points are in a hemispherical, cylindrical, conical or irregular shape.

9. The infrared sauna room with a low electric field and low electromagnetic wave radiation as claimed in claim 1, characterized in that the concave points or convex points are evenly distributed on a surface of the first insulating layer.

10. The infrared sauna room with a low electric field and low electromagnetic wave radiation as claimed in claim 1, characterized in that the concave points or convex points are randomly distributed on a surface of the first insulating layer.

* * * * *